US012700889B2

(12) United States Patent
Chakravarti et al.

(10) Patent No.: US 12,700,889 B2
(45) Date of Patent: Aug. 4, 2026

(54) LATERAL ESCAPE USING TRIANGULAR STRUCTURE OF TRANSCEIVERS

(71) Applicant: Marvell Asia Pte Ltd, Singapore (SG)

(72) Inventors: Aatreya Chakravarti, Williston, VT (US); Wolfgang Sauter, Burke, VT (US); Mark William Kuemerle, Essex Junction, VT (US); Eric William Tremble, Jericho, VT (US)

(73) Assignee: Marvell Asia Pte Ltd, Singapore (SG)

( * ) Notice: Subject to any disclaimer, the term of this patent is extended or adjusted under 35 U.S.C. 154(b) by 102 days.

(21) Appl. No.: 18/801,860

(22) Filed: Aug. 13, 2024

(65) Prior Publication Data

US 2024/0405795 A1 Dec. 5, 2024

Related U.S. Application Data

(63) Continuation of application No. 17/885,554, filed on Aug. 11, 2022, now Pat. No. 12,095,494.
(Continued)

(51) Int. Cl.
*H04K 1/10* (2006.01)
*H04B 1/40* (2015.01)
(Continued)

(52) U.S. Cl.
CPC .............. *H04B 1/40* (2013.01); *H10W 44/20* (2026.01); *H10W 70/611* (2026.01); *H10W 70/635* (2026.01); *H10W 44/209* (2026.01)

(58) Field of Classification Search
CPC ....... H04B 1/40; H01L 23/5384; H01L 23/66; H01L 2223/6616; H01Q 21/065; G06F 30/3312
(Continued)

(56) References Cited

U.S. PATENT DOCUMENTS 8,144,825 B1 * 3/2012 Duong ................ G06F 30/3312
375/354
2017/0162542 A1 6/2017 Chen et al.
(Continued)

OTHER PUBLICATIONS

Masterbond, "MasterSil 800—Product Information," pp. 1-1, Jul. 28, 2021, as downloaded from https://web.archive.org/web/20210728135821/https://www.masterbond.com/tds/mastersil-800.
(Continued)

*Primary Examiner* — Phuong Phu
(74) *Attorney, Agent, or Firm* — Meitar Patents Ltd.; Daniel Kligler

(57) ABSTRACT

An electronic network device includes: (i) an integrated circuit (IC) die disposed on a substrate and configured to exchange signals between the electronic network device and one or more other devices that are remote from the electronic network device, (ii) a plurality of transceiver dies disposed on the substrate and configured to transmit and receive the signals between the IC die and the other devices, one or more of the transceiver dies being spaced away from the IC die, and (iii) one or more decoupling capacitors configured to improve an integrity of one or more of the signals communicated within the electronic network device, the one or more decoupling capacitors being disposed in an area between the IC die and the one or more transceiver dies being spaced away from the IC die.

20 Claims, 4 Drawing Sheets

Related U.S. Application Data

(60) Provisional application No. 63/232,464, filed on Aug. 12, 2021.

(51) Int. Cl.

| | |
|---|---|
| *H04L 27/28* | (2006.01) |
| *H10W 44/20* | (2026.01) |
| *H10W 70/60* | (2026.01) |
| *H10W 70/63* | (2026.01) |

(58) Field of Classification Search
USPC ........ 375/260, 219, 220, 222, 267, 299, 347
See application file for complete search history.

(56) References Cited

U.S. PATENT DOCUMENTS

| | | |
|---|---|---|
| 2020/0051894 A1 | 2/2020 | Wan et al. |
| 2023/0085064 A1* | 3/2023 | Shi ...................... H01Q 21/065 |
| | | 343/702 |

OTHER PUBLICATIONS

International Application # PCT/IB2024/056932 Search Report dated Oct. 23, 2024.

* cited by examiner

*FIG. 2*

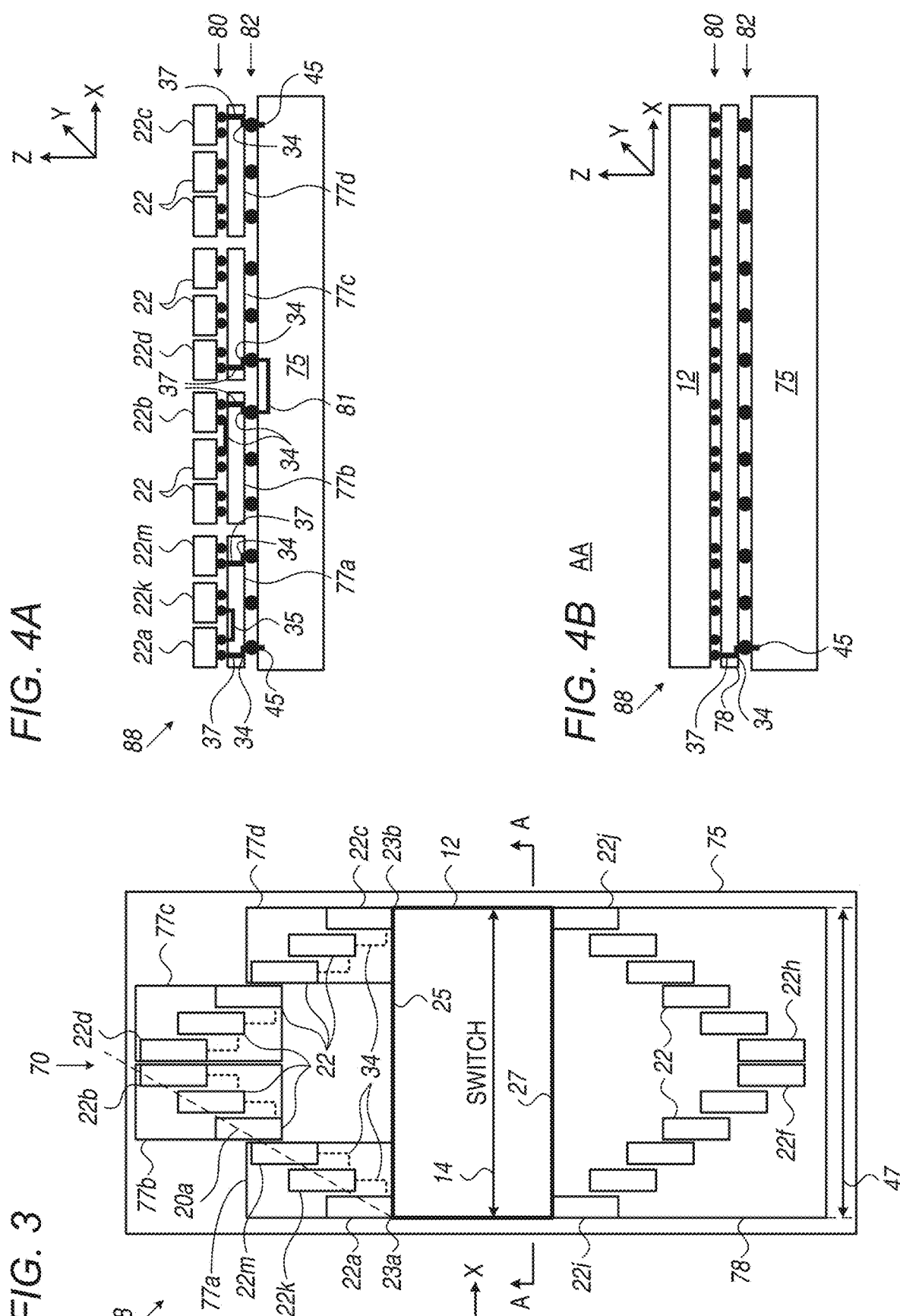

LATERAL ESCAPE USING TRIANGULAR STRUCTURE OF TRANSCEIVERS

CROSS-REFERENCE TO RELATED APPLICATIONS

This application is a Continuation of U.S. patent application Ser. No. 17/885,554, filed Aug. 11, 2022, which claims the benefit of U.S. Provisional Patent Application 63/232,464, filed Aug. 12, 2021.

The disclosures of all these related applications are incorporated herein by reference.

FIELD OF THE DISCLOSURE

The present invention relates generally to electronic network devices, and particularly to methods and systems for improving the bandwidth of an electronic network device comprising a network switch and multiple transceivers.

BACKGROUND

Various techniques are known in the art for packaging electronic network devices comprising switching and/or processing functions, and Serializer/Deserializer (SerDes) lanes of input/output (I/O) functions of such electronic network devices.

Various electronic devices, for example devices for data communications such as switches, are fabricated from monolithic application-specific integrated circuit (ASIC) chips which incorporate one or more processing and/or switching blocks as well as a plurality of SerDes lanes implemented in respective blocks of the monolithic ASIC chip. The bandwidth capacity requirement from such switching products is increasing, constantly which requires additional SerDes lanes. However, the size of such products is constrained by limitations of the fabrication technology, resulting in conventional monolithic designs being unable to meet the required bandwidth capacities when limited to the maximal physical size possible at state-of-the-art process nodes.

The description above is presented as a general overview of related art in this field and should not be construed as an admission that any of the information it contains constitutes prior art against the present patent application.

SUMMARY

An embodiment that is described herein provides an electronic network device, including: (i) an integrated circuit (IC) die configured to exchange signals between the electronic network device and one or more other devices that are remote from the electronic network device, (ii) a plurality of transceiver dies, separate from the IC die, the plurality of transceiver dies being disposed along at least a first axis extending at an acute angle from an edge of the IC die and intersecting the edge at a first point, the transceiver dies being configured to exchange the signals between the IC die and the other devices, and (iii) electrical connections configured to connect between the IC die and at least one of the transceiver dies for exchanging at least some of the signals between the IC die and the transceiver dies.

In some embodiments, the transceiver dies are partially overlapping one another along a first axis that is normal to the edge of the IC die, the transceiver dies do not extend beyond the edge of the IC die. In other embodiments, the transceiver dies include at least first and second transceiver dies, and the electrical connections include first electrical connections configured to connect the first and second transceiver dies, and second electrical connections configured to connect the IC die and at least one of the first and second transceiver dies. In yet other embodiments, the electronic network device includes additional transceiver dies disposed along a second axis extending at an acute angle from the edge of the IC die and intersecting the edge at a second point, different from the first point, the first axis, the second axis and a section of the edge form a triangle.

In some embodiments, the signals include first and second signals, the electronic network device further including one or more decoupling capacitors configured to reduce crosstalk between the first and second signals, the one or more decoupling capacitors being disposed within a triangular area bounded by the IC die, the transceiver dies, and the additional transceiver dies. In other embodiments, the electrical connections are formed in a circuit substrate including at least some of the electrical connections, and the IC die, and the transceiver dies are mounted on the circuit substrate in communication with the electrical connections. In yet other embodiments, the electronic network device includes a first circuit substrate and at least one second circuit substrate, the IC die is mounted on the first circuit substrate, and two or more of the transceiver dies are mounted on the at least one second circuit substrate separate from the first circuit substrate.

In some embodiments, first and second transceiver dies among the plurality of transceiver dies are mounted on the second circuit substrate, and the electrical connections include first electrical connections formed between the first and second circuit substrates, and second electrical connections formed in the second circuit substrate between the first and second transceiver dies. In other embodiments, the first circuit substrate and the at least one second circuit substrate are mounted on and electrically coupled to a third circuit substrate, the second electrical connections are formed in the third circuit substrate, the second electrical connections being configured to electrically couple the IC die and ones of the plurality of the transceiver dies through the first circuit substrate and the at least one second circuit substrate. In yet other embodiments, the IC die includes a switch of a communication network, the communication network being defined by a plurality of connected electronic network devices, at least one of the transceiver dies includes a transceiver chiplet including an IC configured to provide a predefined transceiver functionality and to exchange at least some of the signals between the switch and one or more of the connected electronic network devices of the communication network.

There is additionally provided, in accordance with an embodiment of the present invention, a method for fabricating an electronic network device, the method including disposing on a circuit substrate an integrated circuit (IC) die for exchanging signals between the electronic network device and one or more other devices that are remote from the electronic network device. A plurality of transceiver dies that are separate from the IC die and are for exchanging the signals between the IC die and the other devices, are arranged along at least a first axis extending at an acute angle from an edge of the IC die and intersecting the edge at a first point. Electrical connections that connect between the IC die and at least one of the transceiver dies, are formed for exchanging at least some of the signals between the IC die and the transceiver dies.

The present disclosure will be more fully understood from the following detailed description of the embodiments thereof, taken together with the drawings in which:

BRIEF DESCRIPTION OF THE DRAWINGS

FIG. 2 is a schematic, pictorial illustration of an electronic network device comprising decoupling capacitors, in accordance with an alternative embodiment that is described herein;

FIG. 3 is a schematic, pictorial illustration of the electronic network device of FIG. 2 without the decoupling capacitors, in accordance with another embodiment that is described herein;

FIG. 4A is a side view of the electronic network device of FIG. 3, in accordance with an embodiment that is described herein;

FIG. 4B is a sectional view of the electronic network device of FIG. 3, in accordance with an embodiment that is described herein.

DETAILED DESCRIPTION OF EMBODIMENTS

Figure 1:
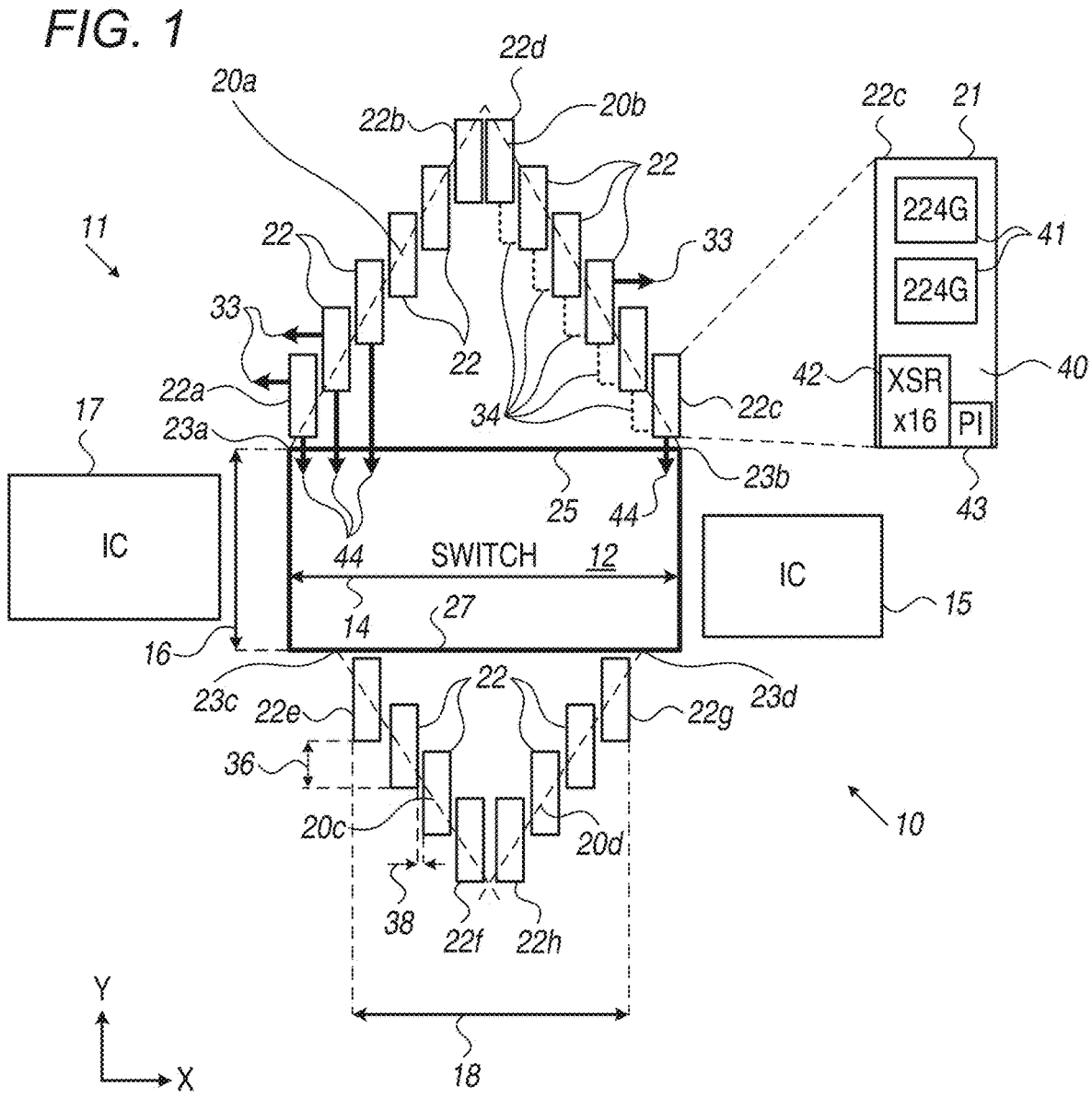
FIG. 1 is a schematic, pictorial illustration of an electronic network device implemented in a communication system, in accordance with an embodiment that is described herein.

Information technology (IT) infrastructure typically comprises high-speed data communication systems used in various applications, such as in data centers. Moreover, artificial intelligence and machine learning applications are driving rapid growth of data traffic inside data center networks and among end users.

For example, an Ethernet-based data communication system typically has multiple Serializer/Deserializer (SerDes) lanes, in which each lane may be required to transfer data at data rates exceeding 100 Gigabits per second (Gbps) and in some cases exceeding 200 Gbps. Advanced Ethernet switches for data centers may comprise multiple SerDes ports each port operating at data rates between about 10 Gbps and 200 Gbps.

Embodiments of the present disclosure that are described herein provide techniques for increasing data rates and reducing interference levels in data communication systems, and more specifically in SerDes lanes of network devices.

In some embodiments, an electronic network device of a data communication system comprises an integrated circuit (IC) die. In the present example, the IC die comprises a switching ASIC of a data communication system, which is configured to exchange signals between the electronic network device and one or more other devices (inside the communication system and/or out of the communication system) that are remote from the electronic network device.

In some embodiments, the SerDes lanes of the electronic network device are implemented as transceiver dies (TDs), in the present example chiplets, which are formed on dies other than and separated from the IC die. The layout of the chiplets in the network device and the structure of the chiplets are described in detail below.

In some embodiments, the TDs are configured to exchange the signals between the IC die and the other devices, and the TDs may be arranged in several configurations for improving the data rate over the SerDes lanes. In an example implementation, the TDs comprise:

A plurality of first TDs arranged along a first axis that is at an acute angle relative to the edge of the IC. The first axis crosses the edge of the IC die at a first point.

A plurality of second TDs arranged along a second axis, which is also at an acute angle relative to the edge of the IC. The second axis crosses the edge of the IC die at a second point, different from the first point.

In other words, the first TDs are disposed along a first axis extending diagonally from a first point along the edge of the IC die, and the second TDs are disposed along a second axis extending diagonally from a second point along the edge of the IC die.

For example, the first and second points are corners of the IC die located along the edges of one side of the IC die. In this example configuration, the side of the IC die and the first and second axes are arranged in a triangle (e.g., an isosceles triangle), in which the edge of the IC die forms the base of the triangle, and the first and second axes are the sides of the triangle. Embodiments related to various configurations and arrangements of the TDs and the IC die are described in detail in FIGS. 1, 2 and 3 below.

In some embodiments, the TDs may comprise any suitable type of chips or chiplets configured to exchange the signals between the IC die and the other devices. In the present example, the TDs comprise chiplets.

Chiplets are elements of a partitioned chip, such as an application-specific integrated circuit (ASIC) chip, partitioned into multiple dies and then interconnected together within a package to make an integrated system. Note in that a prepackaged configuration, the chiplet comprises a physical die having a predefined function (e.g., a transceiver, controller, memory block) of the aforementioned ASIC.

In some embodiments, the IC die (implemented as an ASIC) and the TDs (implemented as chiplets) are formed on separate substrates and are mounted on a common substrate having electrical connections configured to connect between the IC die and at least one of the TDs for exchanging signals therebetween.

In other embodiments, the IC die may be mounted on a first substrate, and one or more of the TDs may be mounted on one or more second substrates. For example, twelve TDs arranged in four packages, each package comprising one of the second substrates having three TDs mounted thereon. In this configuration the first substrate and the plurality of second substrates may be mounted on a third substrate of the electronic network device, so that at least some of the signals may be exchanged between the IC die and the TDs via the third substrate. Embodiments related to various configurations of electrical connections are described in detail, for example, in FIGS. 1, 3, 4A and 4B below.

The description above is presented as a general overview of embodiments of the present disclosure, which are described in detail herein.

FIG. 1 is a schematic, pictorial illustration of an electronic network device 11 implemented in a communication system 10, in accordance with an embodiment that is described herein. In some embodiments, system 10 comprises an integrated circuit (IC) die 12, in the present example a network switch of system 10, which is configured to exchange signals between electronic network device 11 and one or more other devices that are either abutted with, or remote from electronic network device 11.

In some embodiments, IC die 12 is shaped as a rectangle having a first size 14 along the X-axis of an XY coordinate system, and a second size 16 along the Y-axis of an XY coordinate system. In the present example, the first size 14 and the second size 16 cannot exceed about 33 mm and 26 mm, respectively, which is approximately the maximal field size of an optical photolithography system, such as systems produced by ASML Holding (Veldhoven, Netherlands), Nikon Group (Minato-ku, Tokyo), and Canon Inc. (Ohta-ku, Tokyo, Japan).

In the context of the present disclosure and in the claims, the terms "about" or "approximately" for any numerical values or ranges indicate a suitable dimensional tolerance that allows the part or collection of components to function for its intended purpose as described above.

In some embodiments, system 10 comprises additional IC dies, referred to herein as IC 15 and IC 17, which in the example seen, are disposed, relative to IC die 12, along the X-axis of communication system 10, and may comprise any suitable IC, such as but not limited to a processor, a graphics processing unit (GPU), an artificial intelligence (AI) accelerator, and a high-bandwidth memory (HBM) device (that may comprise a stack of multiple memory dies and a processor).

In some embodiments, electronic network device 11 comprises transceiver dies (TDs) 22, implemented as chiplets configured to exchange signals between IC die 12 and other devices, such as (i) ICs 15 and 17 abutted (or located in proximity) with IC die 12, and (ii) remote devices (not shown). Note that some of TDs 22 are denoted by different numerals, such as numerals 22a, 22b, 22c, 22d, 22e, 22f, 22g and 22h, but in the present example, all TDs 22 and 22a-22h comprise similar chiplets, and the derivative numerals 22a-22h will be used herein and in other Figures of the present disclosure solely for annotation and reference to specific elements and for the conceptual clarity of embodiments of the present disclosure. Note that in alternative embodiments, electronic network device 11 may comprise different types of TDs (e.g., having different data rates and/or a difference at least one of structure, size and shape) implemented as different types of chiplets.

Reference is now made to an inset 21 showing an example implementation of a SerDes lane in a chiplet, referred to herein as TD 22c. In some embodiments, TD 22c comprises a semiconductor substrate 40, and a Common Electrical Input/output (I/O) (CEI) XSR (Extra Short Reach) interface, referred to herein as XSR 42, which is formed TD 22, and is configured to transmit and receive data between abutted devices at any suitable data rate, such as but not limited to about 112 Gbps or 224 Gbps. In the present example, XSR 42 has 16 lanes of a single SerDes device and is configured to exchange signals between a pair of abutted TDs 22 and/or between TD 22 and abutted IC die 12.

In some embodiments, TD 22c comprises ultra-high-density interconnects (UHDI), in the present example, an ultra-high density parallel interface (PI) referred to herein as PI 43, which is formed in semiconductor substrate 40 of TD 22c. In the present configuration, PI 43 has a data rate between about 16 Gbps and 32 Gbps, and is configured to drive a shorter length of trace compared to that of XSR 42.

In some embodiments, TD 22c comprises one or more SerDes links, in the present example, two SerDes links 41 mounted on substrate 40. Each of links 41 is configured to exchange signals with a remote device (not shown) in an I/O data rate speed of about 224 Gbps per lane.

Reference is now made back to the general view of FIG. 1. In some embodiments, the bandwidth capacity requirement from electronic network device 11 is constantly increasing to a data rate capacity between about 10 Terabytes per second (Tbps) and 30 Tbps (e.g., about 18.8 Tbps). Another constraint, in some embodiments, is that TDs 22 should not exceed size 14 of edge 25.

One possible approach would be to place TDs 22 one next to the other along edge 25 of IC die 12, as densely as possible. This approach, however, has at least two drawbacks. First of all, the dense packing of TDs leaves insufficient spacing for routing signals to escape the package of electronic network device 11. Moreover, the small distance between adjacent TDs causes mutual interference that reduces the achievable data rates of the individual TDs. In the present example, the nominal data rate of each TD 22 is 224 Gbps, but crowding TDs 22 along the X-axis parallel to edge 25 of IC die 12 may reduce the data rate of the respective TDs 22 by 50%, to about 112 Gbps.

Another possible solution would be to arrange TDs 22 in a wrap-around configuration at least partially surrounding IC die 22. This arrangement enables larger distances between TDs, and also simplifies routing of signals, but may not be applicable for some electronic network device 11 due to interfering placement of ICs 15 and 17 adjacent to IC die 12.

In some embodiments shown in FIG. 1, electronic network device 11 comprises between about twenty (20) TDs 22 (shown in FIG. 1) and twenty-four (24) TDs 22 (e.g., in the example configurations of FIGS. 2 and 3 below), or any other suitable number of TDs 22. In the example configuration of FIG. 1, electronic network device 11 comprises: (i) a first plurality of TDs 22a, 22 and 22b arranged along a first axis 20a that crosses an edge 25 of IC die 12 at a first point 23a, and (ii) a plurality of second TDs 22c, 22 and 22d arranged along a second axis 20b that crosses edge 25 of IC die 12 at a second point 23b. As seen, axes 20a and 20b are both obliquely oriented (i.e., oriented at acute angles) relative to edge 25 of die 12.

In the present example, the first and second points are located at corners of IC die 12. In this example configuration, edge 25 of IC die 12, and axes 20a and 20b are arranged in a triangle, in which edge 25 forms the base of the triangle, and axes 20a and 20b form the sides of the triangle.

In some embodiments, electronic network device 11 comprises: (i) a third plurality of TDs 22e, 22 and 22f arranged along an axis 20c that crosses an edge 27 of IC die 12 at a point 23c and extends diagonally therefrom, and (ii) a plurality of fourth TDs 22g, 22 and 22h arranged along an axis 20d that crosses edge 27 of IC die 12 at a point 23d and extends diagonally therefrom. As described for axes 20a and 20b above, axes 20c and 20d are both obliquely oriented (i.e., oriented at acute angles) relative to edge 27 of die 12, in an embodiment. Note that points 23c and 23d are not located at corners of IC die 12, and a distance 18 between the remote edges thereof is smaller than size 14 of IC die 12. Moreover, edge 27 and axes 20c and 20d are arranged in a triangle in which edge 27 forms the base, and axes 20c and 20d form the sides of the triangle, and this triangle is smaller than the triangle of edge 25 and axes 20a and 20b described above. The size of the triangle is determined by the bandwidth capacity requirements of electronic network device 11.

In some embodiments, TDs 22 are partially overlapping one another along a first axis (e.g., the Y-axis) that is normal to the edge (e.g., edges 25 and 27), and TDs 22 do not exceed beyond the size of IC die 12 along a second axis (e.g., the X-axis) that is parallel to the edge(s).

In some embodiments, the arrangements of TDs 22 along the aforementioned axes enable a staircase structure of TDs 22, which reduces the overlap between adjacent TD 22, and therefore, increases the available surface of each TD 22 for electrical connections and increase the routing options of signals to/from each TD 22. In the example of FIG. 1, a distance 36 along the Y-axis is indicative of the staircase structure enabled by the partial overlapping between TD 22e and abutted TD 22.

In other embodiments, TDs 22 may be arranged along the axes 20 without overlapping between abutted TDs 22 along the Y-axis. In such embodiments, the size of distance 36 of overlap between adjacent TDs 22 may be approximately equal to the size of TD 22 along the Y-axis. In alternative embodiments, TDs 22 may be arranged along the axes with some spacing therebetween along the Y-axis.

In some embodiments, a distance 38 between adjacent TDs 22 is indicative of a spacing between each pair of the respective TDs 22, and may reduce crosstalk between signals conducted in abutted TDs 22. Note that the partial overlapping and spacing apart abutted TDs 22 enable additional routing traces to escape the package of TDs 22, and thereby, to improve the operational data rate of each lane. For example, when using the partial overlapping configuration, TDs 22 are arranged in a structure of a staircase that enables the routing of signals using several configurations described below.

In some embodiments, the routing of signals to and from TDs 22 is implemented using electrical traces of one or more circuit substrates described below. In the present example, the routing configurations comprise: (i) routing 33 that serve as escape route from the package, implemented using electrical traces on a suitable substrate. In the present example the traces extend from TDs 22 along the X-axis for connecting TDs 22 with devices external to electronic network device 11, (ii) serial routing 34, implemented using electrical traces connecting between chiplet of abutted TDs 22, and (iii) routing 44, implemented using electrical traces connecting between the chiplet (e.g., TD 22) and the chipedge (e.g., edge 25). Note that the traces of routing 34 are connecting between two XSRs 42 of a respective pair of TDs 22, or between two PIs 43 of a respective pair of TDs 22.

In the example of FIG. 1 the routing between TDs 22 and IC die 12 may be carried out in a serial manner and in a parallel manner. For example, (i) TDs 22 disposed along axis 20b are connected to IC die 12 in a serial configuration by using routings 34 between abutted TDs 22 and only TD 22c connected to IC die 12 using routing 44, and (ii) TDs 22 disposed along axis 20a are connected to IC die 12 in a parallel configuration by using routings 44 between each TD 22 and IC die 12.

Note that this example combination of routings 33, 34 and 44 is provided by way of a non-limiting example and may be implemented in electronic network device 11 using any other suitable configuration. For example, (a) routing 44 may be implemented only between (i) IC 12 and (ii) TDs 22a, 22c, 22e and 22g, and routing 34 may be implemented between all other pairs of abutted TDs 22 (as shown along axis 20b), or (b) routing 44 may be implemented between IC die 12 and every TD 22 (as shown along axis 20a). Moreover, the routing may be carried out using any other suitable combination of routings 33, 34 and 44.

In other embodiments, the inter-chiplet spacing along the X-axis may not be required, in such embodiments, distance 38 between abutted TDs 22 may be eliminated so that one or more additional TDs 22 (or any other suitable devices) may be inserted within the axes 20 of electronic network device 11.

In the example of FIG. 1, TDs 22a, 22c, 22e and 22g are not placed in contact with IC die 12, but are connected using routing 44.

The configuration of electronic network device 11 shown in FIG. 1, is provided by way of example, in order to illustrate certain problems that are addressed by embodiments of the present disclosure and to demonstrate the application of these embodiments in enhancing the performance of such an electronic network device. Embodiments of the present disclosure, however, are by no means limited to this specific sort of example electronic network device, and the principles described herein may similarly be applied to other sorts of and configurations of electronic network devices, such as but not limited to the electronic network devices shown, for example, in FIGS. 2 and 3 below.

Figure 2:
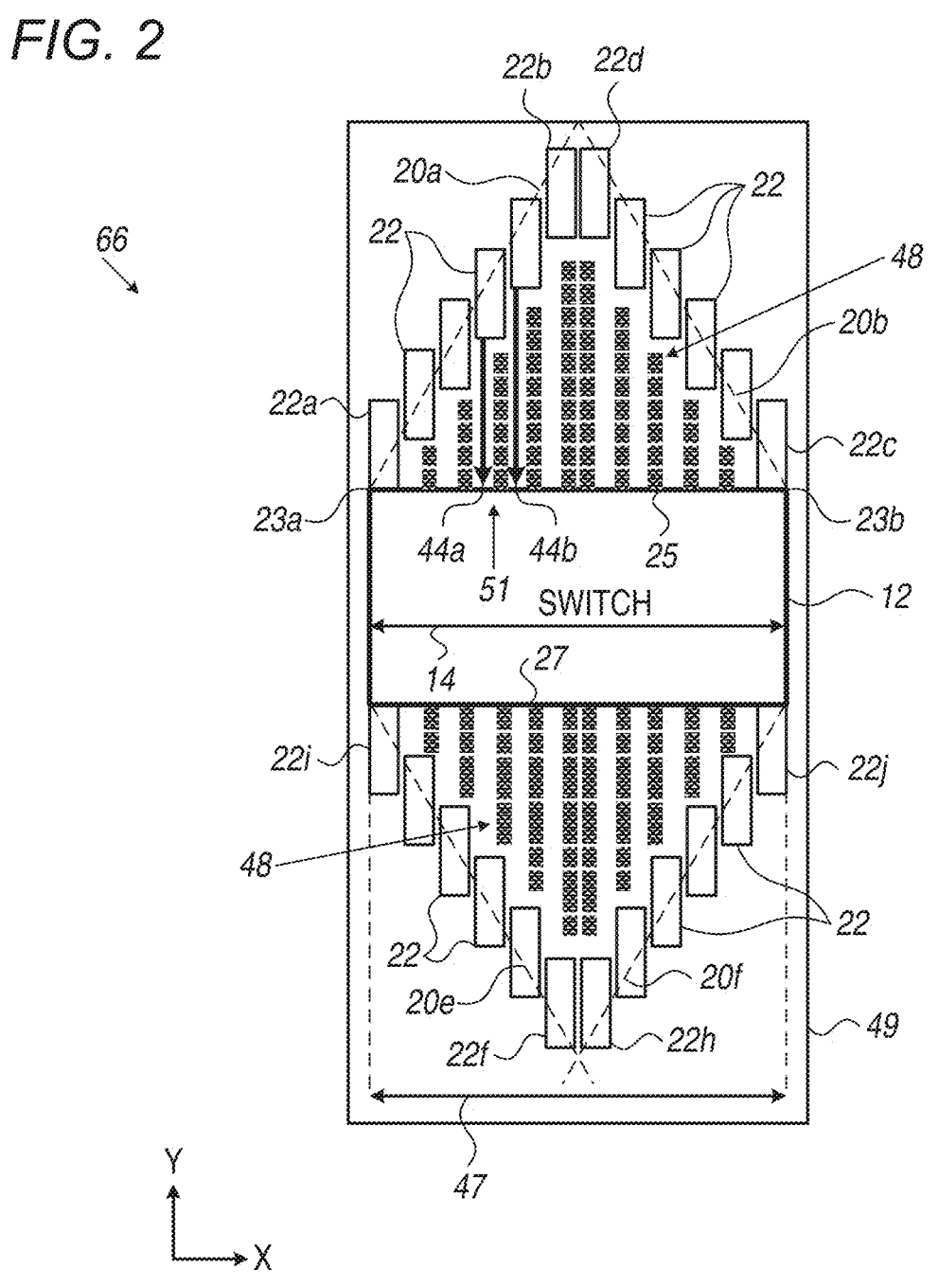

FIG. 2 is a schematic, pictorial illustration of an electronic network device 66, in accordance with an alternative embodiment that is described herein.

In some embodiments, electronic network device 66 comprises a circuit substrate referred to herein as a substrate 49, in the present example a suitable type of circuit board (CB), or any other suitable substrate having the electrical connections shown and described in FIG. 1 above.

In some embodiments, electronic network device 66 comprises four sets of TDs 22 (described hereinafter) and IC die 12, which are all disposed on substrate 49. The four sets of TDs 22 are arranged along four axes 20 extending from four respective corners of IC die 12. More specifically, (i) 22a, and TDS 22b all TDS 22 therebetween are disposed on substrate 49 along axis 20a, (ii) TDs 22c, 22d and all TDs 22 therebetween are disposed on substrate 49 along axis 20b, (iii) TDs 22i, 22f and all TDs 22 therebetween are disposed on substrate 49 along axis 20e, and (iv) TDs 22j, 22h and all TDs 22 therebetween are disposed on substrate 49 along axis 20f. In this configuration, electronic network device 66 comprises two similar triangularly shaped structures: (i) edge 25 and TDs disposed along axes 20a and 20b, and (ii) edge 27 and TDs disposed along axes 20e and 20f.

In the example of FIG. 2, TDs 22 that are disposed along axes 20e and 20f do not extend beyond the end of edge 27 along the X-axis, more specifically, a distance 47 between the edges of TDs 22i and 22j does not exceed beyond size 14 of IC die 12 along the X-axis. Similarly, TDs 22 that are disposed along axes 20a and 20b do not extend beyond size 14 of IC die 12.

In some embodiments, electronic network device 66 comprises decoupling capacitors (DECAPs) 48, which are disposed on substrate 49 and are confined within a triangular area bounded, for example, by edge 25 of IC die 12 and axes 20a and 20b. Similarly, an array of additional DECAPS 48 is disposed within a triangular area bounded between edge 27 of IC die 12 and axes 20e and 20f.

In some embodiments, DECAPs 48 are configured to reduce crosstalk between signals (e.g., signal transmitted between TDs 22 and IC die 12, and signals transmitted between different TDs 22). For example, a column 51 of DECAPS 48 is configured to reduce crosstalk between the signals transmitted in the traces of routings 44a and 44b, and thereby improve the integrity of signal conducted within electronic network device 66. Note that DECAPs 48 may be implemented in the other electronic network devices, such as in the electronic network devices shown in FIGS. 1 and 3 of the present disclosure.

In the example of FIG. 2, axes 20 of the triangles are similarly dimensioned to form an isosceles triangle. In other embodiments, TDs 22 may be disposed along uneven axes 20, so that the angles between the IC die edge and the respective axes may not be equal, and/or the length of the axes of the respective triangle may not be equal.

In alternative embodiments, TDS 22 may be arranged using any other suitable configuration, which is based on axes that extend diagonally from the IC edge but are not necessarily shaped as triangles. In one example, TDs 22 may be arranged along a single axis that extends diagonally from the IC edge. In another example, TDs 22 may be arranged along two or more axes coupled with the IC edge and having a similar orientation relative to the IC edge (resembling a sawtooth shape). In such embodiments, DECAPs 48 are arranged differently for obtaining improved signal integrity within electronic network device 66.

Note that the configurations and variations described above may be implemented, with necessary adaptations, in the other electronic network devices, such as in the electronic network devices shown in FIGS. 1 and 3 of the present disclosure.

FIG. 3 is a schematic, pictorial illustration of an electronic network device 88, in accordance with another embodiment that is described herein. Electronic network device 88 may be implemented, for example, instead of electronic network device 11 of FIG. 1 above.

As explained below, in the present embodiment the TDs are divided into groups (e.g., three TDs per group). Each group of TDs is mounted on a respective substrate in a staggered configuration. These substrates (each carrying a group of TDs) are then laid along one or more axes that extend diagonally from the IC edge. This solution achieves a similar layout of TDs as the solutions of FIGS. 1 and 2, but with a smaller number of building blocks.

In the embodiment seen in FIG. 3, electronic network device 88 comprises (i) IC die 12 and (ii) a group of TDs, in the present example, TDs 22i, 22j, 22f, 22h and TDs 22 arranged therebetween. IC die 12 and the group of TDs 22i, 22j, 22f, 22h and TDs 22 are mounted on a circuit substrate, referred to herein as a substrate 78.

In some embodiments, electronic network device 88 comprises TDs 22a, 22k and 22m arranged along a section of axis 20a. TDs 22a, 22k and 22m are mounted on a circuit substrate, referred to herein as a substrate 77a (whose features are described below) and are interconnected using traces of substrate 77a referred to herein as routing 34, which have been described in FIG. 1 above.

In some embodiments, the TDs 22 and 22b that are arranged along the other section of axis 20a, are mounted on a circuit substrate, referred to herein as a substrate 77b similar to substrate 77a.

In some embodiments, electronic network device 88 comprises additional substrates 77c and 77d, each of which having three TDS 22 mounted thereon and interconnected using the same configuration and techniques described for substrate 77a and the TDs mounted thereon.

In some embodiments, substrates 77 and 78 may comprise a silicon-based (or other suitable semiconductor-based) interposer having a redistributed layer (RDL) of electrical conductors (not shown) patterned on the surface thereof (or any other suitable type of electrical traces) and through-silicon vias (TSVs) (not shown).

In other embodiments, substrates 77 and 78 may comprise a circuit board having a laminated substrate and electrical traces and vias. In yet other embodiments, substrates 77 and 78 may comprise a ceramic substrate having electrical traces and vias formed therein. In alternative embodiments, substrates 77 and 78 may comprise a polymer-based substrate having electrical traces and vias formed therein, or any other suitable type of substrate.

Note that the asymmetric arrangement of the TDs in substrates along the Y-axis (e.g., substrates 77a and 77b are a mirror image of substrates 77d and 77c, respectively) is provided by way of example, and in other embodiments, the arrangement of TDs 22 on substrates 77a-77d may be applied (with necessary adaptations) to the group of TDs, i.e., TDs 22i, 22j, 22f, 22h and TDs 22 arranged therebetween. In other words, TDs 22i, 22j, 22f, 22h and TDs 22 that are disposed therebetween, may be mounted on four substrates 77, similar to substrates 77a-77d, each substrate 77 having three of the TDs mounted thereon. In this configuration, electronic network device 88 may have a symmetric arrangement of substrates 77 and TDs 22 facing edges 25 and 27.

In some embodiments, electronic network device 88 comprises a circuit substrate, in the present example a circuit board (CB) 75, and substrates 77 and 78 are mounted thereon. In other embodiments, CB 75 may be replaced with any other suitable substrate, such as but not limited to the substrate types described for substrates 77 and 78 above.

In some embodiments, CB 75 may comprise GL 102 substrate produced by Ajinomoto Fine-Techno Co., Inc. (Kanagawa, 210-0801, Japan) or any other suitable type of high-density interface (HDI) substrate.

In alternative embodiments, substrates 77 and 78 may be removed from the configuration of all TDs 22 and IC die 12 may be mounted directly on CB 75 (as shown in FIG. 2 but without DECAPs 48 of FIG. 2). For example, electronic network device 88 may be implemented in system 10 of FIG. 1 instead of electronic network device 11, and substrates 77 and 78 may be removed. In this example configuration, TDs 22, IC die 12, and ICs 15 and 17 are all mounted on CB 75 and are interconnected using electrical traces and vias formed in advance in CB 75.

In some embodiments, the arrangement of a package comprising multiple (e.g., four) circuit substrates, each substrate having a plurality of TDs mounted thereon. For example, TDs 22a, 22k and 22m are mounted on substrate 77a, and the other nine TDs are mounted on substrates 77b, 77c and 77d, in three groups of three TDs, respectively.

In some embodiments, the assembly process is simplified because instead of assembling twelve chiplets (or twenty-four chiplets) on a substrate, groups of three chiplets are already prepackaged, and subsequently, substrates 77 are mounted on CB 75 using any suitable configuration.

In alternative embodiments, instead of mounting three TDs 22 on substrate 77, electronic network device 88 may comprise any other suitable type of and number of substrates (not shown), each may have any other suitable number of TDs 22 mounted thereon. For example, a given electronic network device (not shown) may comprise: (i) a first substrate may have a single TD 22 mounted thereon, (ii) a second larger substrate may have two TDs 22 mounted thereon, (iii) a third substrate (larger than the second substrate) having five TDs 22 mounted thereon using any suitable arrangement, and (iv) a fourth substrate having the first, second and third substrates mounted thereon using any suitable configuration.

The configuration of TDs 22, substrate 77 and CB 75 is shown in FIG. 4A in a side view from a direction 70, and the configuration of IC die 12, substrate 78, and CB 75 is shown in FIG. 4B in a sectional view AA.

FIG. 4A is a side view of electronic network device 88 from direction 70, in accordance with an embodiment that is described herein. In some embodiments, TDs 22 are connected to substrates 77 using bumps 80, in the present example copper-based bumps, and substrates 77 are electrically connected to CB 75 via bumps 82.

In some embodiments, substrates 77 comprise various types of electrical connections implemented by patterning TSVs 37, and various configurations of electrically conductive traces, referred to herein as routings 34, 45, 35, and 81 described herein.

Note that the routing architectures presented herein are schematic and simplified for the sake of conceptual clarity, and may be different from the implementation in the substrates, bumps, and bumps of a real-life product of any of the electronic network devices described in FIGS. 1-3 above.

In some embodiments, TDS 22a and 22c are connected to IC die 12 mounted on substrate 78 (both shown in FIG. 3 above and in FIG. 4B below), using a routing architecture comprising: (i) bump 80, (ii) TSV 37, (iii) routing 34, bump 82 and routing 45 extended along the Y-axis of the XYZ coordinate system. Note that the extension of the routing architecture implemented in CB 75 and in substrate 78 is shown in FIG. 4B below.

In some embodiments, electronic network device 88 comprises: (a) routing 34 connecting between TDs 22 and 22b, and (b) routing 35 comprises a buried electrical trace 35 configured to connect between TDs 22a and 22k (e.g., instead of routing 34, also shown in FIGS. 1 and 3 above).

In other embodiments, electronic network device 88 comprise a routing architecture between TD 22b (mounted on substrate 77b) and TD 22d (mounted on substrate 77c). The routing architecture comprising: (i) bumps 80, (ii) TSVs 37, (iii) routings 34, bumps 82 and routing 81 extended along the X-axis of CB 75. Note that in the configuration described in FIGS. 1-3 above, TDs 22b and 22d are not interconnected, so that the above routing architecture is presented for demonstrating the connection and routing of signals between TDs 22 mounted on different substrates 77, via CB 75 (or any other suitable substrate common to two or more substrates 77 mounted thereon).

FIG. 4B is a sectional view AA of electronic network device 88, in accordance with an embodiment that is described herein. In some embodiments, bumps 80 are disposed between IC die 12 and substrate 78, and bumps 82 are disposed between substrate 78 and CB 75. Note that the routing architectures of FIG. 4A above are applicable, with necessary changes, to substrate 78 and CB 75, and therefore, are not replicated in the example configuration of FIG. 4B.

In one example implementation of the routing architecture, signals are routed between IC die 12 and TD 22 of FIG. 4A above using the routing architecture described in FIG. 4A above, and the following routing architecture. In the present example, TD 22a of FIG. 4A above is connected to IC die 12, using a routing architecture comprising: (i) bump 80, (ii) TSV 37, (iii) routing 34, bump 82 and routing 45 extended along the Y-axis of the XYZ coordinate system. In this configuration, the signals are routed between substrates 77 and 78 (and between IC die 12 and TD 22a) via the electrically conductive traces of routing 45 formed in the layers of CB 75 using any suitable CB fabrication process known in the art. Note that the extension of the routing architecture in substrates 75 and 77 is shown and has been described in detail in FIG. 4A above.

In alternative embodiments, TDs 22i, 22j, 22f, 22h and TDs 22 are mounted on substrate 78, and IC die 12 is mounted directly on bumps 82 disposed over CB 75. This configuration reduces the impedance associated with exchanging signals between IC die 12 and CB 75 via substrate 78, however it may create topography in the package (e.g., between the upper surfaces of IC die 12 and chiplets 22.

Figure 5:
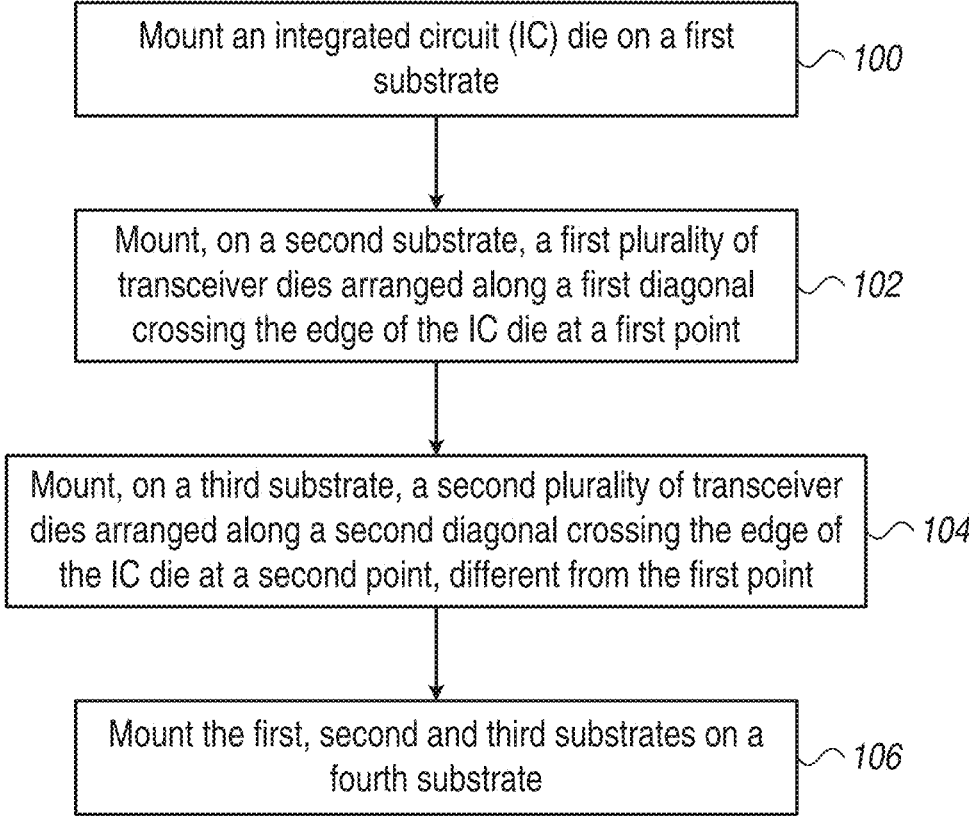
FIG. 5 is a flow chart that schematically illustrates a method for fabricating the electronic network device of FIG. 3, in accordance with an embodiment that is described herein.

FIG. 5 is a flow chart that schematically illustrates a method for fabricating electronic network device 88, in accordance with an embodiment that is described herein.

The method begins at ASIC mounting operation 100 with mounting IC die 12 over bumps 80 and substrate 78 having electrically conductive traces and TSVs 37, as described in detail in FIGS. 3 and 4B above.

At a first transceivers mounting operation 102, a first plurality of TDs 22 (e.g., TDs 22a, 22k and 22m) is mounted on a second substrate (e.g., substrate 77a) having electrical connections such as electrically conductive traces and/or TSVs 37 described in FIGS. 3 and 4A above. TDs 22a, 22k and 22m are arranged along axis 20a extending from edge 25 of IC die 12 at point 23a. Operation 102 is described in detail in FIGS. 3 and 4A above.

At a second transceivers mounting operation 104, a second plurality of TDs 22 (e.g., TDs 22 and 22c) is mounted on a third substrate (e.g., substrate 77d) having electrical connections such as electrically conductive traces and TSVs 37 described in FIGS. 3 and 4A above. TDs 22 and 22c are arranged along axis 20b crossing edge 25 of IC die 12 at point 23b (different from point 23a). Operation 104 is described in detail in FIGS. 3 and 4A above.

At a substrate mounting operation 106 that concludes the method, substrates 78, 77a and 77d are mounted over bumps 82 and CB 75 having electrical connections such as the electrical traces and vias referred to as routings 81 and 45, as described in detail in FIGS. 3, 4A and 4B above.

In some embodiments, the method comprises the formation of at least some of the electrical connections in substrates 77 and 78 and optionally in CB 75, as described in FIGS. 3, 4A and 4B above. In alternative embodiments, at least one of substrates 77 and 78 and CB 75 may be prepared by a supplied thereof, and the method may comprise the above-describe mounting of: (i) TDs 22 over bumps 80 and substrates 77, (ii) IC die 12 over bumps 80 and substrate 78, and (iii) substrates 77 and 78 over bumps 82 and CB 75, as described in detail in FIGS. 3, 4A and 4B above.

In alternative embodiments, TDs 22 and IC die 12 may be mounted directly over a common substrate, such as CB 75 or any other suitable substrate. Note that in such embodiments, substrates 77 and 78 are removed from the configuration of the electronic network device and the aforementioned arrangement of TDs 22 and IC die 12, as described in detail e.g., in FIG. 2 above, is carried out over CB 75.

In other embodiments, the method may comprise additional operations, such as but not limited to the disposing of DECAPs 48 over the respective one or more substrates, as described in detail in FIG. 2 above.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic network device, comprising:
an integrated circuit (IC) die disposed on a substrate and configured to exchange signals between the electronic network device and one or more other devices that are remote from the electronic network device;

a plurality of transceiver dies disposed on the substrate and configured to transmit and receive the signals between the IC die and the other devices, one or more of the transceiver dies being spaced away from the IC die, wherein the plurality of transceiver dies comprise first and second transceiver dies being set apart from one another along a first axis, and being spaced away from the IC die along a second axis different from the first axis, the first and second transceiver dies being configured to exchange with the IC die respective first and second signals among the signals exchanged between the electronic network device and the one or more other devices, wherein (i) the IC die and the first transceiver die are configured to exchange the first signal along a first path, and (ii) the IC die and the second transceiver die are configured to exchange the second signal along a second path different from the first path, the first and second paths being parallel with the second axis; and one or more decoupling capacitors configured to improve an integrity of one or more of the signals communicated within the electronic network device, the one or more decoupling capacitors being disposed in an area between the IC die and the one or more transceiver dies being spaced away from the IC die.

2. The electronic network device according to claim 1, wherein the IC die comprises a switch of a communication network, the communication network being defined by a plurality of connected electronic network devices, wherein at least one of the transceiver dies comprises a transceiver chiplet comprising an IC configured to provide a predefined transceiver functionality and to exchange at least some of the signals between the switch and one or more of the connected electronic network devices of the communication network.

3. The electronic network device according to claim 1, wherein the one or more decoupling capacitors are disposed: (i) along the second axis between the IC die and at least one of the first and second transceiver dies, and (ii) between the first and second paths along the first axis.

4. The electronic network device according to claim 1, wherein the one or more decoupling capacitors are configured to reduce crosstalk between at least two of the signals.

5. The electronic network device according to claim 1, wherein the area between the IC die and the plurality of transceiver dies comprises a triangular area.

6. The electronic network device according to claim 1, wherein the substrate comprises a first circuit substrate and at least one second circuit substrate separate from the first circuit substrate, wherein the IC die is disposed on the first circuit substrate and wherein two or more of the transceiver dies are respectively disposed on the at least one second circuit substrate.

7. The electronic network device according to claim 6, comprising first electrical connections formed between the first and second circuit substrates, and second electrical connections formed in the second circuit substrate between two or more of the transceiver dies among the plurality of transceiver dies.

8. The electronic network device according to claim 7, wherein the first circuit substrate and the at least one second circuit substrate are mounted on and electrically coupled to a third circuit substrate, wherein the first electrical connections are formed in the third circuit substrate, the first electrical connections being configured to electrically couple the IC die and ones of the plurality of the transceiver dies through the first circuit substrate and the at least one second circuit substrate.

9. A method for fabricating an electronic network device, the method comprising:

disposing on a substrate an integrated circuit (IC) die for exchanging signals between the electronic network device and one or more other devices that are remote from the electronic network device;

disposing on the substrate a plurality of transceiver dies for transmitting and receiving the signals between the IC die and the other devices, one or more of the transceiver dies being spaced away from the IC die, wherein disposing the plurality of transceiver dies comprises disposing first and second transceiver dies for exchanging with the IC die respective first and second signals among the signals exchanged between the electronic network device and the one or more other devices, and wherein the first and second transceiver dies being set apart from one another along a first axis, and being spaced away from the IC die along a second axis different from the first axis, wherein (i) the IC die and the first transceiver die are disposed for exchanging the first signal along a first path, and (ii) the IC die and the second transceiver die are disposed for exchanging the second signal along a second path different from the first path, the first and second paths being parallel with the second axis; and disposing, in an area between the IC die and the one or more transceiver dies being spaced away from the IC die, one or more decoupling capacitors for improving an integrity of one or more of the signals communicated within the electronic network device.

10. The method according to claim 9, wherein disposing the IC die comprises disposing a switch of a communication network, the communication network being defined by a plurality of connected electronic network devices, wherein disposing at least one of the transceiver dies comprises disposing a transceiver chiplet comprising an IC for providing predefined transceiver functionality and for exchanging at least some of the signals between the switch and one or more of the connected electronic network devices of the communication network.

11. The method according to claim 9, wherein disposing the one or more decoupling capacitors are disposed: (i) along the second axis between the IC die and at least one of the first and second transceiver dies, and (ii) between the first and second paths along the first axis.

12. The method according to claim 9, wherein the one or more decoupling capacitors are disposed for reducing crosstalk between at least two of the signals.

13. The method according to claim 9, wherein disposing the one or more decoupling capacitors in the area between the IC die and the plurality of transceiver dies comprises disposing the one or more decoupling capacitors in a triangular area.

14. The method according to claim 9, wherein the substrate comprises a first circuit substrate and at least one second circuit substrate separate from the first circuit substrate, wherein disposing the IC die and the transceiver dies comprises (i) disposing the IC die on the first circuit substrate, and (ii) disposing two or more of the transceiver dies on the at least one second circuit substrate, respectively.

15. The method according to claim 14, comprising (i) forming first electrical connections between the first and second circuit substrates, and (ii) forming, in the second circuit substrate, second electrical connections between two or more of the transceiver dies among the plurality of transceiver dies.

16. The method according to claim 15, comprising mounting the first circuit substrate and the at least one second circuit substrate on a third circuit substrate and electrically coupling between (i) the first circuit substrate and the at least one second circuit substrate, and (ii) third circuit substrate, and forming the first electrical connections in the third circuit substrate for electrically coupling the IC die and ones of the plurality of the transceiver dies through the first circuit substrate and the at least one second circuit substrate.

17. The electronic network device according to claim 1, wherein at least one of the transceiver dies comprises a Serializer/Deserializer (SerDes) link configured to exchange signals with a remote device.

18. The method according to claim 9, wherein at least one of the transceiver dies comprises a Serializer/Deserializer (SerDes) link configured to exchange signals with a remote device.

19. An electronic network device, comprising:
    an integrated circuit (IC) die disposed on a substrate and configured to exchange signals between the electronic network device and one or more other devices that are remote from the electronic network device;
    a first plurality of transceiver dies disposed on the substrate along a first axis that crosses an edge of the IC die at a first point, and a second plurality of transceiver dies disposed on the substrate along a second axis that crosses the edge of the IC die at a second point different from the first point, the first and second pluralities of transceiver dies being configured to transmit and receive the signals between the IC die and the other devices, wherein at least one of the transceiver dies comprises a Serializer/Deserializer (SerDes) link configured to exchange signals with a remote device; and
    one or more decoupling capacitors configured to reduce crosstalk between signals communicated within the electronic network device, the one or more decoupling capacitors being disposed within a triangular area bounded by the edge of the IC die, the first axis, and the second axis.

20. The electronic network device according to claim 19, wherein the IC die comprises a switch of a communication network.

* * * * *